United States Patent
Delepaut et al.

(10) Patent No.: US 9,654,055 B2
(45) Date of Patent: May 16, 2017

(54) RADIO-FREQUENCY HIGH POWER AMPLIFIER WITH BROADBAND ENVELOPE TRACKING BY MEANS OF REVERSED BUCK CONVERTER

(71) Applicant: Agence Spatiale Europeenne, Paris (FR)

(72) Inventors: Christophe Delepaut, Katwijk (NL); Nicolas Le Gallou, Sassenheim (NL)

(73) Assignee: Agence Spatiale Europeenne, Paris (FR)

( * ) Notice: Subject to any disclaimer, the term of this patent is extended or adjusted under 35 U.S.C. 154(b) by 0 days.

(21) Appl. No.: 14/784,681

(22) PCT Filed: Apr. 15, 2013

(86) PCT No.: PCT/IB2013/001041
§ 371 (c)(1),
(2) Date: Oct. 15, 2015

(87) PCT Pub. No.: WO2014/170710
PCT Pub. Date: Oct. 23, 2014

(65) Prior Publication Data
US 2016/0056770 A1    Feb. 25, 2016

(51) Int. Cl.
*H03F 3/04*    (2006.01)
*H03F 1/02*    (2006.01)
(Continued)

(52) U.S. Cl.
CPC .......... *H03F 1/0227* (2013.01); *H02M 3/156* (2013.01); *H02M 3/158* (2013.01);
(Continued)

(58) Field of Classification Search
CPC .......... H03F 1/0227; H03F 3/19; H03F 3/193; H03F 3/21; H03F 3/2171;
(Continued)

(56) References Cited

U.S. PATENT DOCUMENTS 4,059,811 A * 11/1977 Hoffman .................. H03F 1/34
330/277
4,320,352 A * 3/1982 Rubin .................. H03F 1/0261
330/277

(Continued)

FOREIGN PATENT DOCUMENTS

EP    2 432 118 A1    3/2012
FR    2 799 063 A1    3/2011

OTHER PUBLICATIONS

Rodriguez et al., "A Multiple-Input Digitally Controlled Buck Converter for Envelope Tracking Applications in Radiofrequency Power Amplifiers", IEEE Transactions on Power Electronics, vol. 25, No. 2, Feb. 2010 369.*

(Continued)

*Primary Examiner* — Steven J Mottola
*Assistant Examiner* — Hafizur Rahman
(74) *Attorney, Agent, or Firm* — Alston & Bird LLP (57) ABSTRACT

A radio-frequency power amplifier with envelope tracking, having a power RF amplifying device for amplifying a RF signal and a switching DC/DC converter for providing the power RF amplifying device with a DC power supply at a voltage level (VSUPP) proportional to an envelope of the RF signal, wherein the switching DC/DC converter has a reversed buck topology. Advantageously the switching device is a N-type GaN Field Effect Transistor having its drain connected to the ground.

12 Claims, 7 Drawing Sheets

(51) Int. Cl.
| | |
|---|---|
| *H02M 3/158* | (2006.01) |
| *H03F 3/19* | (2006.01) |
| *H02M 3/156* | (2006.01) |
| *H03F 3/193* | (2006.01) |
| *H03F 3/21* | (2006.01) |
| *H03F 3/217* | (2006.01) |

(52) U.S. Cl.
CPC ............... *H03F 3/19* (2013.01); *H03F 3/193* (2013.01); *H03F 3/21* (2013.01); *H03F 3/2171* (2013.01); *H03F 2200/102* (2013.01); *H03F 2200/351* (2013.01); *H03F 2200/451* (2013.01); *Y02B 70/1483* (2013.01)

(58) Field of Classification Search
CPC ......... H03F 2200/102; H03F 2200/351; H03F 2200/451; H02M 3/156; H02M 3/158; Y02B 70/1483
USPC ........ 330/255, 269, 273, 297; 375/295, 297, 375/318
See application file for complete search history.

(56) References Cited

U.S. PATENT DOCUMENTS

| | | | | |
|---|---|---|---|---|
| 5,387,880 | A * | 2/1995 | Kobayashi | H03F 1/226 330/277 |
| 7,103,114 | B1 | 9/2006 | Lapierre | |
| 7,242,252 | B2 * | 7/2007 | Taylor | G05F 3/205 330/285 |
| 7,304,539 | B2 * | 12/2007 | Tsurumaki | H03F 1/301 330/285 |
| 2009/0160555 | A1 | 6/2009 | Sun | |
| 2012/0139641 | A1 * | 6/2012 | Kaczman | H03F 1/0222 330/295 |
| 2014/0184336 | A1 * | 7/2014 | Nobbe | H03F 1/0227 330/296 |

OTHER PUBLICATIONS

International Search Report and Written Opinion for Application No. PCT/IB2013/001041 dated Dec. 10, 2013.

Jacqmaer, P. et al., *Accurately Modelling of Parasitics in Power Electronics Circuits Using an Easy RLC-Extraction Method*, Instrumentation and Measurement Technology Conference (I2MTC), 2012 IEEE International, IEEE (May 13, 2012), 6 pages.

Le Gallon, N. et al., *Over 10MHz Bandwidth Envelope-Tracking DC/DC Converter for Flexible High Power GaN Amplifiers*, Microwave Symposium Digest (MTT), 2011 IEEE MTT-S International, IEEE (Jun. 5, 2011) 4 pages.

Busking, E. et al., *1 GHz GaAs Buck Converter for High Power Amplifier Modulation Applications*, European Microwae Integrated Circuits Conference Amsterdam, Oct. 2012.

Darbandi et al., *Flexible S-band SSPA for Spade Appiation*, NASA/ESA Conference on Adaptive Hardware and Systems (2008).

Forestier, S. et al., *Development of a New Dynamic Bias Control System to Increase the Power Added Efficiency and the Linearity of a Power Amplifier for M-QAM Modulation*, Microwave Techniques and Technologies, 2005, ESTEC, The Netherlands.

Green, C. R. et al., *High Efficiency 240W GaN SSPA Demonstrator for Space Applications*, ESA-MoD GaN Round Table, Sep. 2010, ESTEC, The Netherlands.

Hassan, M. et al., *A Wideband CMOS/GaAs HBT Envelope Tracking Power Amplifier for 4G LTE Mobile Terminal Applications*, Transactions on Microwave Theory and Techniques, vol. 60, No. 5, May 2012.

Jeong, J. et al., *High-Efficiency WCDMA Envelope Tracking Base-Station Amplifier Implemented With GaAs HVHBTs*, IEEE Journal of Solid-State Circuits, vol. 44, N. 10, Oct. 2009.

Leroy, F. et al., *Experimental Demonstration of High Frequency Switching Converter for Envelope Tracking Power Amplifier Applications*, $63^{rd}$ International Astronautical Congree, Napes, Italy, Oct. 2012.

Norris, M. et al., *10 MHz Large Signal Bandwidth, 95% Efficient Power Supply for 3G-4G Cell Phone Base Stations*, Twenty-Seventh Annual IEEE on Applied Power Electronics Conference and Exposition (APEC), 2012.

Pala, V. et al., *Integrated High-Frequency Power Converters Based on GaAs pHEMT: Technology Characterization and Design Examples*, Transactions on Power Electronics, May 2012.

Pala, V. et al., *Application of GaAs pHEMT Technology for Efficient High Frequency Switching Regulators*, Proceedings of the $22^{nd}$ International Symposium on Power Semiconductor Devices & Ics, Hiroshima, 2010.

Strydom, J., *eGaN FET-Silicon Power Shoot-Out* vol. 8: *Envelope Tracking*, Power Electronics Technology, May 2012.

ST Application Note AN513/0393 "Topologies for Switched Mode Power Supplies".

International Rectifier Application Note AN-978 "HV Floating MOS-Gate Driver ICs".

Semiconductor Application Note NCL30100-D "Fixed Off Time Switched Mode LED Driver Controller".

\* cited by examiner

RADIO-FREQUENCY HIGH POWER AMPLIFIER WITH BROADBAND ENVELOPE TRACKING BY MEANS OF REVERSED BUCK CONVERTER

FIELD

The invention relates to a radio-frequency power amplifier with envelope tracking, in particular for use in space telecommunications. The invention can also be applied e.g. to mobile telecommunication systems.

BACKGROUND

Radio Frequency (RF) transmitters on board of spacecraft do not always run at maximum power level. When operated at reduced RF power, the consumption of a RF High Power Amplifier (HPA) can be significantly reduced by lowering the voltage of its power supply.

The current state-of-the-art power supply for HPAs is referred to as "flexible" and consists in powering amplifiers with discrete preselected DC voltages. See e.g.:

Darbandi et al., "Flexible S-band SSPA for Space Application", NASA/ESA Conference on Adaptive Hardware and Systems, 2008; and C R Green et al., "High Efficiency 240 W GaN SSPA Demonstrator for Space Applications" ESA-MoD GaN round Table, September 2010, ESTEC, The Netherlands.

The power supply level is not optimized at any time of the HPA operation and the power saving is therefore limited.

A more advanced approach, which is the subject of an intense research effort, is referred to as "envelope tracking". It consists in providing the HPA with a continuously variable DC voltage, following ("tracking") the envelope of the RF signal to be amplified. This solution works well when the envelope bandwidth is limited to a few hundreds of kHz up to some MHz—e.g. in the case of terrestrial mobile systems (e.g. base stations, mobile phones). However, space applications have large bandwidths (20-100 MHz); therefore efficient envelope tracking requires a very fast DC/DC converter.

For achieving high efficiency, the DC/DC converter should be a switching converter, or chopper. Moreover, telecommunication satellites generally use a 100 V power bus and a HPA power supply at 25-50 V, which imposes the use of a step-down converter. In practice, the most suitable topology is the "buck" one, and a RF field effect transistor (FET) has to be used as the switching element of the converter, due to its low parasitic capacitances. Moreover, the transistor has to be of N-type, because high-frequency, high-voltage P-type transistors are not commercially available, and in any case would have poor performances.

Using a N-type FET as the switching element of a buck converter, however, implies having its source alternatively connected to the input voltage and to the ground, and therefore experiencing fast variations of its voltage level. This is not a serious problem as long as the input voltage does not exceed a few volts, which allows directly driving the floating gate of the transistor. So, very high-frequency DC/DC converters using both GaAs Depletion and Enhanced mode transistors have been disclosed, see e.g.:

V. Pala et al., "Integrated High-Frequency Power Converters Based on GaAs pHEMT: Technology Characterization and Design Examples", IEEE Transactions on Power Electronics, May 2012;

V. Pala et al., "Application of GaAs pHEMT Technology for Efficient High Frequency Switching Regulators", Proceedings of The 22nd International Symposium on Power Semiconductor Devices & ICs, Hiroshima, 2010; and E. Busking et al., "1 GHz GaAs Buck Converter for High Power Amplifier Modulation Applications", European Microwave Integrated Circuits Conference, Amsterdam, October 2012.

At higher voltage levels, however, the floating gate has to be driven through an isolation transformer. But then, at very high switching frequency, the parasitic capacitance between transformer coils will lead peak current during switching whose amplitudes become incompatible with proper converter operation.

This problem would not arise with P-type transistors. However, RF transistors capable of handling voltages of several tens or volts or more (Silicon, GaAs or GaN technology) are only available in N-type.

A possible solution to avoid this difficulty consists in using a switching converter driven at a significantly lower frequency for tracking a low-pass filtered version of the envelope. See e.g. EP 2 432 118. Clearly, this results in a reduced efficiency.

Other alternative solutions have been proposed

Implementing multisource power supply with fast discrete commutation between each DC voltage to follow the envelope variations. See e.g. FR2799063 and S. Forestier et al., "Development of a new dynamic bias control system to increase the power added efficiency and the linearity of a power amplifier for M-QAM modulation", ESA Microwave Workshop on Microwave techniques and technologies, 2005, ESTEC, The Netherlands.

Using a power converter operated at reduced switching frequency, ensures the envelope tracking up to a given upper frequency, in combination with high bandwidth linear regulator. See e.g. J. Jeong et al., "High-Efficiency WCDMA Envelope Tracking Base-Station Amplifier Implemented With GaAs HVHBTs", IEEE Journal of Solid-State Circuits, Vol. 44, N° 10, October 2009 or M. Hassan et al., "A Wideband CMOS/GaAs HBT Envelope Tracking Power Amplifier for 4G LTE Mobile Terminal Applications", IEEE Transactions on Microwave Theory and Techniques, Vol. 60, N° 5, May 2012.

Using larger number of converters (e.g. 10) operated at proportionally lower switching frequency. See e.g. J. Strydom, "eGaN FET-Silicon Power Shoot-Out Volume 8: Envelope Tracking", Power Electronics Technology, May 2012 or Mark Norris et al, "10 MHz Large Signal Bandwidth, 95% Efficient Power Supply for 3G-4G Cell Phone Base Stations", Twenty-Seventh Annual IEEE on Applied Power Electronics Conference and Exposition (APEC), 2012.

However they all lead to complex and expensive systems, with a much lower efficiency than that which could be achieved in principle using a simpler buck converter.

Radio-frequency amplifiers with broadband envelope tracking have been realized using a fast step-up DC/DC converter with "boost" topology. See:

F. Leroy et al., "Experimental Demonstration of High Frequency Switching Converter for Envelope Tracking Power Amplifier Applications", 63$^{rd}$ International Astronautical Congress, Naples, Italy, October 2012

N. Le Gallou et al., "Over 10 MHz Bandwidth Envelope-Tracking DC/DC converter for Flexible High Power GaN Amplifiers", IEEE International Microwave Symposium 2011

Indeed, when a N-type transistor is used as the switching element of a boost converter, its source is connected to the ground, and therefore no isolation transistor is required to drive its gate. However, this approach is only possible in applications having a bus voltage which is lower than the voltage of the power supply of the HPA. This can be the case in scientific spacecraft, but not in telecommunication satellites. Moreover, boost converters are notoriously difficult to control because they are non-minimum phase.

The invention aims at solving the aforementioned drawbacks of the prior art.

SUMMARY

According to the invention, the problem of performing broadband envelope tracking (which implies high switching frequencies, typically of several MHz) at high voltage levels (tens of volts) is solved by resorting to an unconventional converter topology, called "reversed buck". Although known per se, this topology is generally considered unsuitable to use in power conditioning because its output voltage is not referenced to the ground. However, the present inventors have realized that this is not a drawback in the specific application considered here, namely envelope tracking.

An object of the present invention is then a radio-frequency power amplifier with envelope tracking, comprising a power RF amplifying device for amplifying a RF signal and a switching DC/DC converter for providing said power RF amplifying device with a DC power supply at a voltage level proportional to an envelope of said RF signal; characterized in that said switching DC/DC converter has a reversed buck topology.

According to particular embodiments of the invention:

Said power RF amplifying device may be connected between a first conductor which, during operation, is maintained at a constant positive voltage with respect to a ground reference point, and a second conductor serving as a local voltage reference; and said switching DC/DC converter may be connected for setting the voltage level of said second conductor with respect to said ground reference point at a positive value which is lower than the voltage of said first conductor.

Said switching DC/DC converter may comprise a switching device having a first terminal connected to said ground reference point and a second terminal connected to said second conductor through an inductor and to said first conductor through a rectifier, said rectifier being configured to allow current flow only form said switch to said first conductor; also comprising a filtering capacitor connected between said first conductor and said second conductor.

Said switching device may be a N-type Field Effect Transistor, said first terminal being a source and said second terminal being a drain. Using a different switching device is not excluded, but generally less advantageous. In particular, said switching device may be a GaN transistor.

The radio-frequency power amplifier may further comprise a DC blocking capacitor connected between an output port of said power RF amplifying device and a RF-load, and a second DC blocking capacitor connected between an external RF source and the RF transistor input (gate).

The radio-frequency power amplifier may further comprise a decoupling capacitor connected between said second conductor and said ground reference point.

The radio-frequency power amplifier may further comprise a driving circuit for driving said switching device with a Pulse Width Modulation (PWM) signal representative of an envelope of the RF signal to be amplified. Advantageously, said driving circuit may be configured for driving said switching device in such a way that the voltage difference between said first conductor and said second conductor is proportional to said envelope of said RF signal. In particular, said PWM signal may have a frequency greater or equal to 20 MHz (allowing the tracking of a broadband envelope), for example greater or equal to 50 MHz, and the constant positive voltage of the first conductor may be greater or equal to 25 V, and preferably to 50 V or 100 V (because, as discussed above, alternative solution exist for lower voltage levels).

BRIEF DESCRIPTION OF THE DRAWINGS

Figure 1:
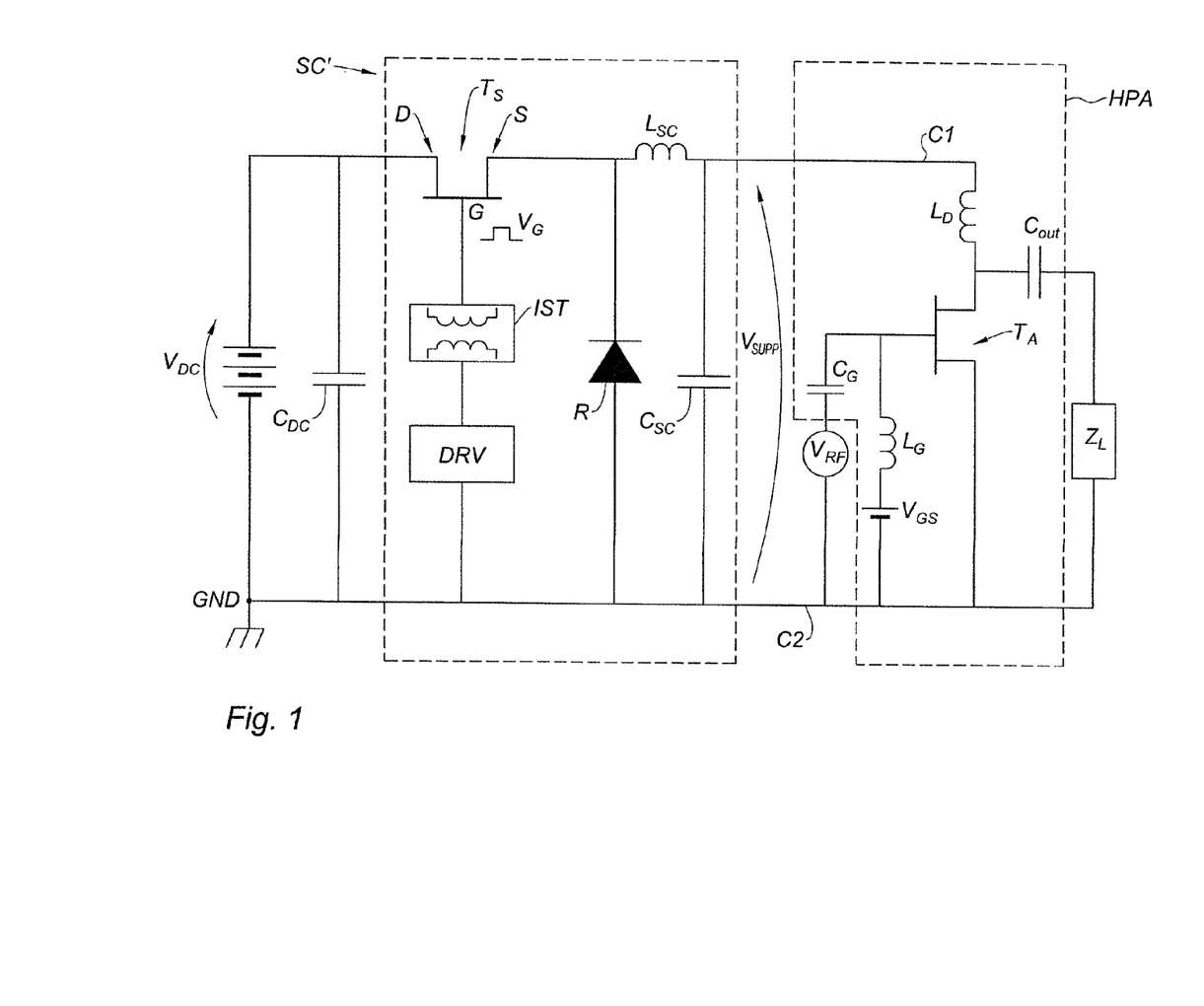
FIG. 1 shows a radio-frequency power amplifier with envelope tracking comprising a conventional buck converter supplying a RF amplifier.

Additional features and advantages of the present invention will become apparent from the subsequent description, taken in conjunction with the accompanying drawings, wherein:

FIG. 1 shows the electric scheme of an envelope tracking RF amplifier HPA driven by a conventional buck DC/DC converter (reference SC').

DETAILED DESCRIPTION

The RF amplifier HPA comprises a N-type Depletion mode or Enhanced mode GaN transistor $T_A$, having its drain connected to a first conductor C1 through an inductor $L_D$, its source directly connected to a second conductor C2 and the gate biased at a voltage $V_{GS}$ through an inductor $L_G$.

The RF signal to be amplified, $V_{RF}$, is applied to the gate of the transistor through a DC blocking capacitor $C_G$. The amplified signal is extracted from the transistor drain through a blocking capacitor $C_{out}$ to be applied to a load $Z_L$, e.g. an antenna.

The second conductor C2 is connected to the ground (GND) to serve as a reference voltage. The first conductor C1 is at a positive voltage $V_{SUPP}$ whose value is set by the buck converter SC'.

The converter SC' comprises, in a conventional way, a switching device $T_S$ selectively connecting and disconnecting the first conductor C1 to a DC power supply (battery in parallel to a filtering capacitor $C_{DC}$) at a voltage $V_{DC}$ which is higher or equal to the maximum allowed value of $V_{SUPP}$. The converter also comprises an inductor $L_{SC}$ connected between the switching device $T_S$ and the first conductor C1, a capacitor $C_{SC}$ connected between the first and the second conductor and a rectifier (diode or, as disclosed in EP 2 432 118, transistor connected as a two-terminal device) having an anode connected to the second conductor (i.e. the ground) and a cathode connected between the switching device and the inductor.

The operation of this conventional buck converter is known in the art. See e.g. ST Application Note AN513/0393 "Topologies for switched mode power supplies".

As explained above, however, switching device $T_S$ has to work at a very high frequency (e.g. 100 MHz) and at a quite high voltage level (e.g. $V_{DC}$=100V, $V_{SUPP}$ comprised between 8 and 50 V), which requires the use of a RF transistor, hence N-type, for switching. As it can be seen, this means that the source S of the transistor is floating between the ground (0 V) and the input voltage ($V_{DC}$), while the drain D is at a constant voltage $V_{DC}$. As a consequence, the gate G must also be floating. This implies the use of an insulating transformer IST between the gate G and the driving circuit DRV which generates a pulse width modulation signal $V_G$ for opening and closing the switch.

As mentioned above, however, at very high switching frequency the parasitic capacitance between transformer coils induces peak currents during switching, whose amplitudes can be incompatible with proper converter operation. For example, a 1 pF parasitic capacitance sinks a 1 A current peak to switch from 0 V to 100 V in 1% of the switching period at 100 MHz. Such a current level is far above the level of current circulating in the drive circuitry.

Other known schemes for driving floating gates are even less suitable for use at high frequency/high voltage because they are more complex, therefore showing higher losses and/or having higher parasitic capacitances. See e.g. International Rectifier Application Note AN-978 "HV Floating MOS-Gate Driver ICs".

Figure 2:
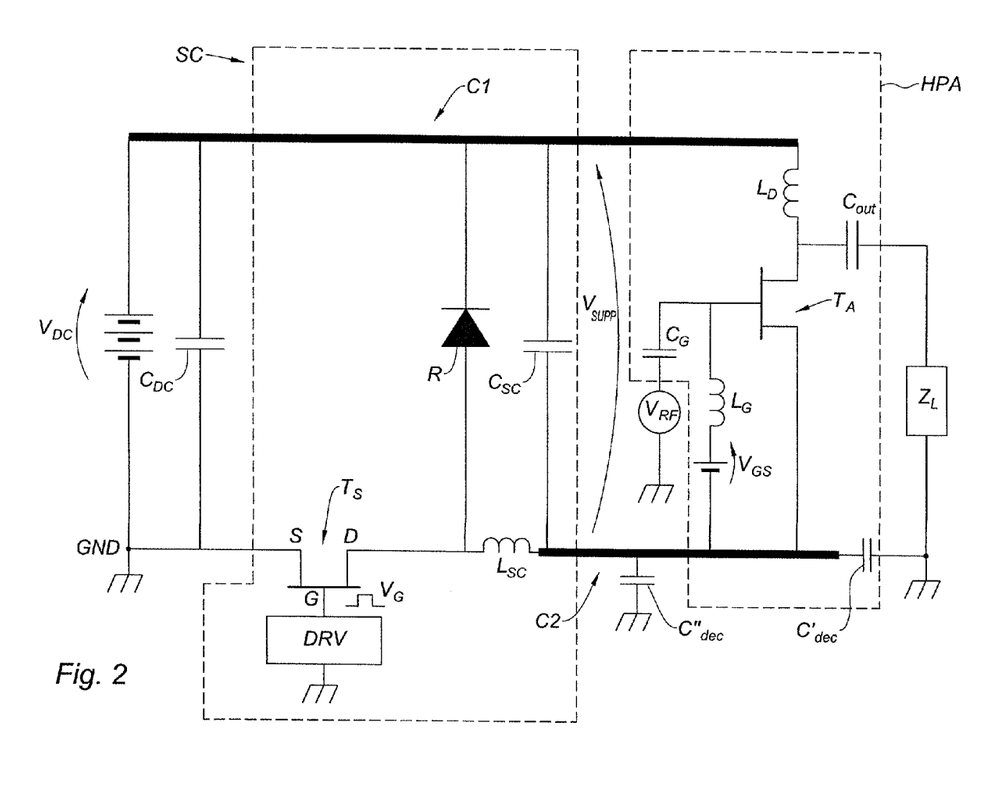
FIG. 2 shows a radio-frequency power amplifier with envelope tracking comprising a reversed buck converter supplying a RF is amplifier according to an embodiment of the present invention.

FIG. 2 shows the electric scheme of an envelope tracking RF amplifier driven by a "reversed buck" converter SC, according to the invention.

As it can be seen, in the reversed buck converter the switching device $T_S$ and the inductor $L_{SC}$ are disposed between the second conductor C2 and the ground GND. When the switching device is implemented by a N-type transistor, its source S is connected to the ground and it is the drain D which is floating, being connected to the second conductor C2 via the inductor $L_{SC}$. This allows the driving circuit DRV to be directly connected to the gate G of the transistor, without the need for a transformer. As a consequence the problem discussed above, due to the parasitic capacitance of the transformer, does not arise.

Figure 3A:
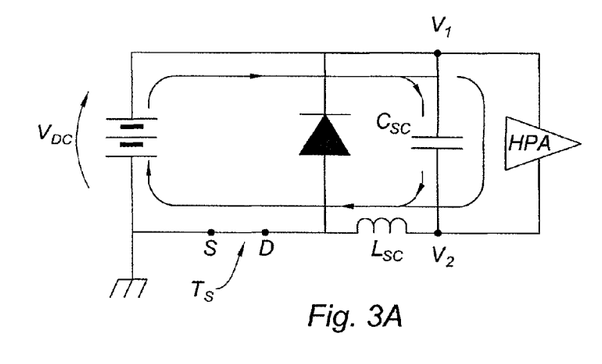
FIGS. 3A to 3D illustrate the operation of the reversed buck converter of FIG. 2.
Figure 3B:
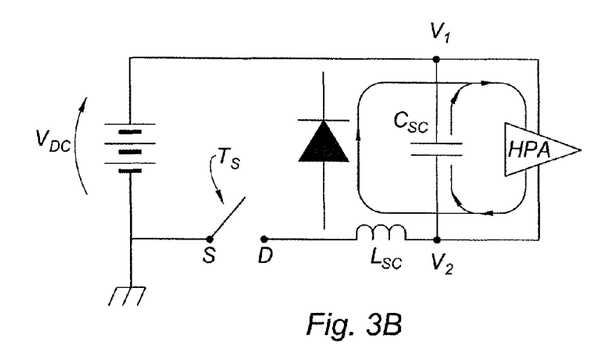
Figure 3C:
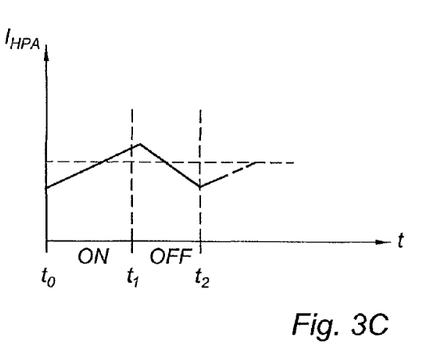
Figure 3D:
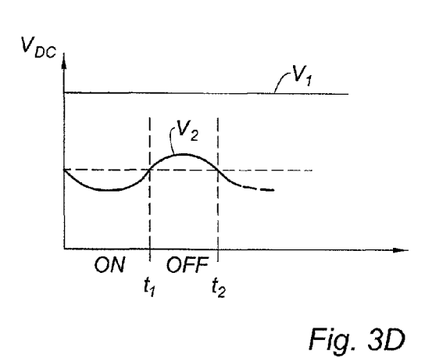

FIGS. 3A, 3C and 3D show that, when the switch $T_s$ is closed (between time $t_0$ and time $t_1$) a linearly increasing electric current flows from the battery through C1 and C2 to power the HPA, the excess/deficit of current charging/discharging capacitor $C_{SC}$. The "positive" terminal of this capacitor is at a constant voltage $V_1=V_{DC}$, while the "negative" terminal is at a voltage $V_2$ slightly oscillating according to the charge/discharge cycle. At $t=t_2$, the switch opens. As illustrated on FIG. 3B, a linearly decreasing current keeps flowing through the inductor $L_{SC}$ to continue powering the HPA, the excess/deficit of current charging/discharging the capacitor $C_{SC}$. $V_1$ remains equal to $V_{DC}$ while $V_2$ slightly oscillates according to the charge/discharge cycle. The average value of $V_2$ depends on the duty cycle $\tau=(t_1-t_0)/(t_2-t_0)$, and so does the supply voltage level of the amplifier, $V_{SUPP}=V_2-V_1=V_2(\tau)-V_{DC}$.

The reversed buck topology is known in the art of power electronics. See:

P. Jacqmaer et al. "Accurately modelling of parasitics in power electronics circuits using an easy RLC-extraction method" IEEE International Instrumentation and Measurement Technology Conference (I2MTC), 13-16 May 2012, pages 1441-1446; and On Semiconductor Application Note NCL30100-D "Fixed Off Time Switched Mode LED Driver Controller".

However, the reverse buck topology is usually not used for power conditioning because its output voltage is referenced to the input voltage ($V_{DC}$) and not to the ground. In particular, in spacecrafts it is required that all the equipments are referenced to a common ground, which is not compatible with the use a reverse buck.

However, this feature is not a drawback in the application considered here because the blocking capacitors $C_G$ and $C_{out}$ isolate the RF signal source and the RF load from the DC potential difference between the amplifier HPA and the rest of the payload. Moreover, one or more decoupling capacitors ($C_{dec}'$, $C_{dec}''$ on FIG. 2) are provided between the second conductor C2 and the ground. In the embodiment of FIG. 2, both decoupling capacitors $C_{dec}'$, $C_{dec}''$ are necessary because they allow grounding at different physical locations. Moreover, $C_{dec}'$ operates at radio-frequency, while $C_{dec}''$ is used to filter the current flowing through the passive capacitance of inductor $L_{SC}$, and operates at the switching frequency of the TS transistor. Therefore, the two capacitors are technologically different.

Figure 4:
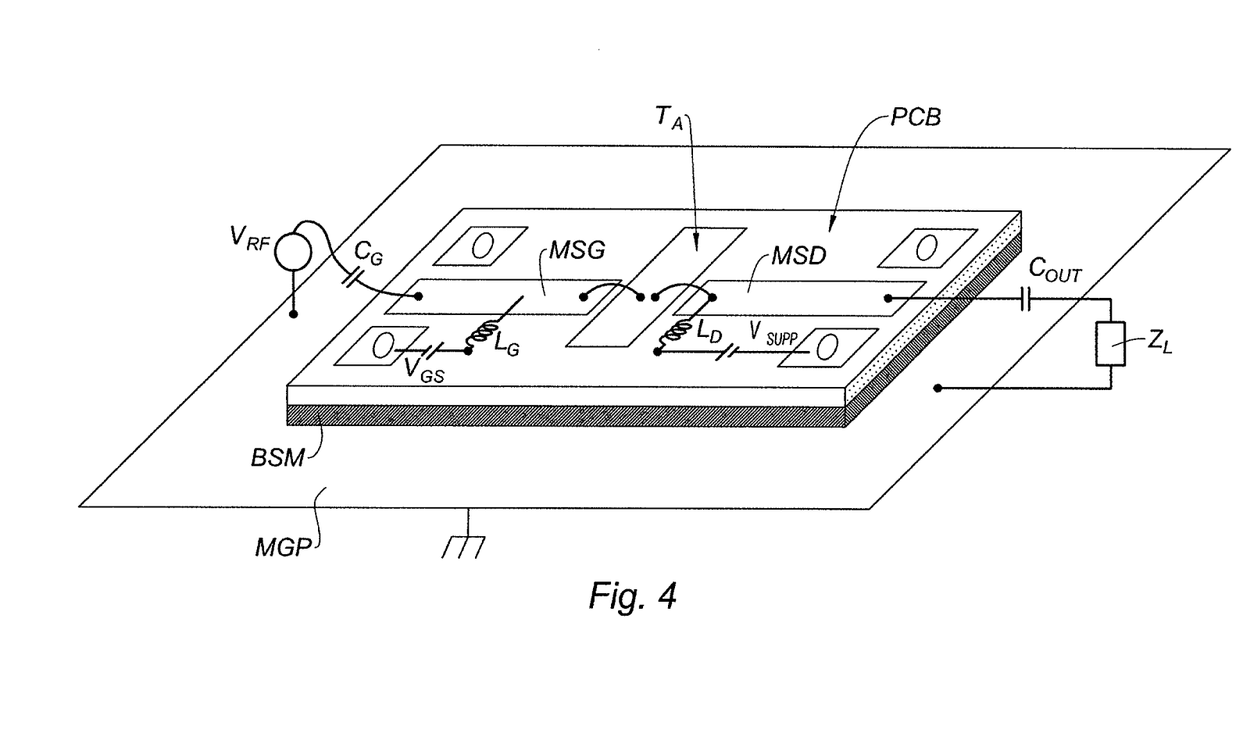
FIG. 4 illustrates a possible implementation of the conventional envelope-tracking RF power amplifier of FIG. 1.

FIG. 4 illustrates a physical implementation of a conventional RF high-power amplifier, of the kind represented under the reference HPA on FIG. 1. The amplifier is mounted on a printed circuit board PCB having a back-side metallization BSM which is in direct contact with a wide metal ground plane MGP constituting a reference physical ground to which the microstrip lines MSG and MSD, feeding the gate and drain of the amplifying transistor $T_A$, are referenced. The DC voltages $V_{GS}$ and $V_{SUPP}$ (the latter being generated by the switching converter SC', not represented on FIG. 4) are also referenced to the metal ground plane MGP through vias connecting the front face of the printed circuit board to the metalized back-side. The RF input signal is fed from the external source $V_{RF}$, referenced to the metal ground plane.

Figure 5:
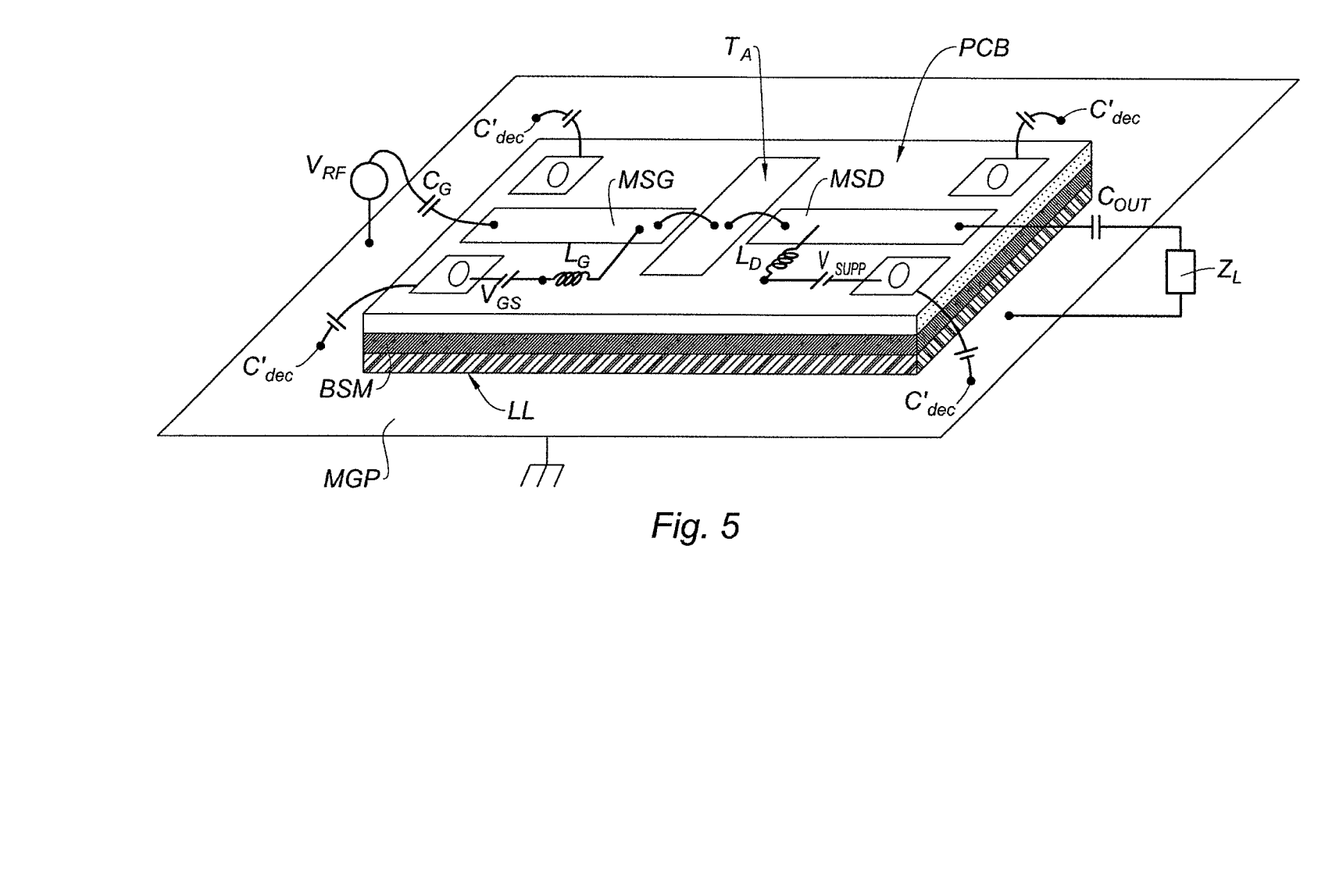
FIG. 5 illustrates a possible implementation of the inventive envelope-tracking RF power amplifier of FIG. 2.

FIG. 5 illustrates a physical implementation of a RF high-power amplifier according to an embodiment of the present invention, of the kind represented under the reference HPA on FIG. 2. Like in the case of FIG. 4, the amplifier is mounted on a printed circuit board PCB having a back-side metallization BSM. However, said metallization is separated from the metal ground plane MGP by an insulating layer IL, so as to constitute an "internal" ground reference (corresponding to the second conductor C2 of FIG. 2) floating with respect to the "external" ground reference MGP (which corresponds to the "GND" reference on FIG. 2). The internal and external ground references are connected together at radio-frequency by decoupling capacitors $C'_{dec}$. The decoupling capacitor $C_{dec}''$ is not represented because it is internal to the switching converter SC.

The source of the amplifying transistor $T_A$ is connected to back-side metallization BSM (not visible on the figure) and the microstrip line MSG is referenced to it, while the input RF voltage $V_{RF}$ is referenced to the external ground reference MGP, the necessary voltage shift being ensured by capacitor $C_G$. Similarly, the load $Z_L$ is referenced to the external MGP while the microstrip line MSD is referenced to the local ground BSM, the necessary voltage shift being ensured by the output capacitor $C_{out}$. The DC voltages $V_{GS}$ and $V_{SUPP}$ (the latter being generated by the switching converter SC, not represented on FIG. 5) are also referenced to the local ground through vias connecting the front face of the printed circuit board to the metalized back-side BSM.

Figure 6:
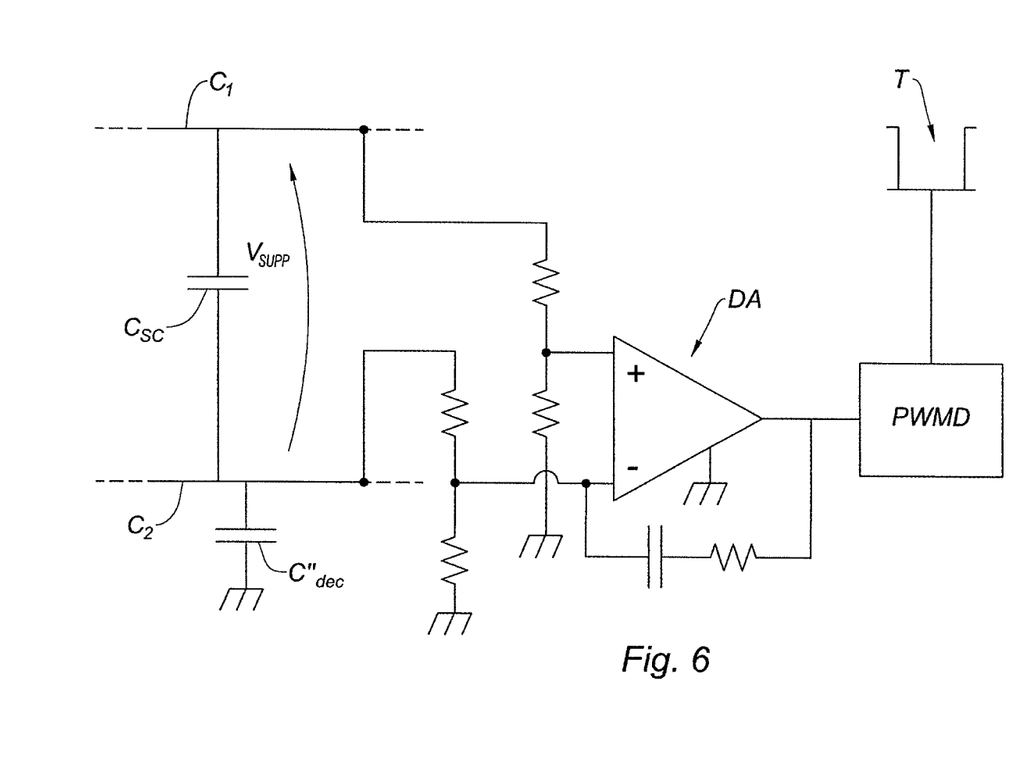
FIG. 6 shows a control scheme of the reversed buck converter of FIG. 2.

An advantageous feature of the invention is that buck converters can easily be controlled in closed loop, which is not the case for boost converters. FIG. 6 shows a block diagram of a feedback control for the envelope tracking amplifier of FIG. 2. A high bandwidth differential amplifier DA built around an operational amplifier with a series RC feedback network extracts, integrates and amplifies the output voltage $V_{SUPP}$ of the reverse Buck converter in order to perform Proportional-Integral (PI) regulation, and provides it to the a pulse-width modulation driver PWMD in charge of controlling the ON/OFF operation of the converter switch $T_S$.

Figure 7A:
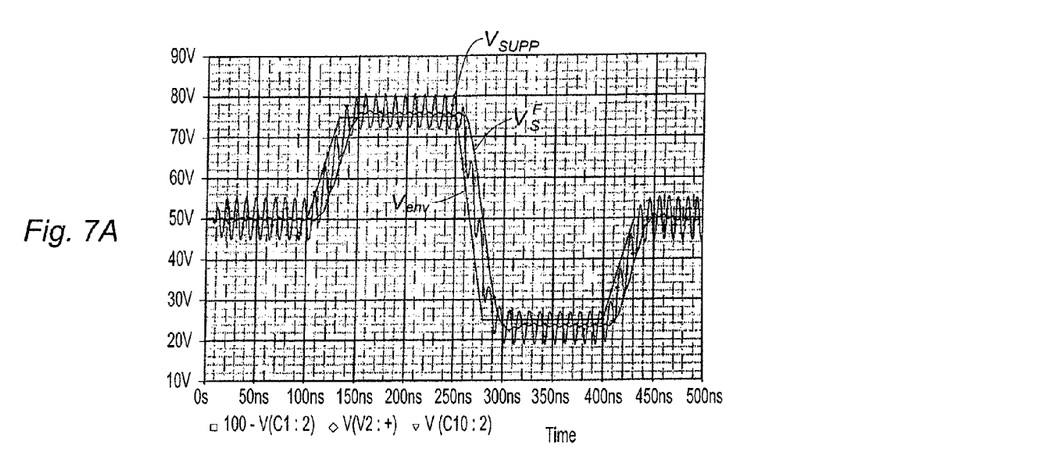
FIGS. 7A, 7B and 7C show the result of a numerical simulation in both time and frequency domains of the envelope tracking converter of FIG. 2.

On FIG. 7A, $V_{env}$, made of straight line segments, represents the envelope of the RF signal i.e. the reference signal for the control of the converter. The output of the buck converter SC, $V_{SUPP}$, features a limited amplitude ripple at the switching frequency and follows the reference signal quite well thanks to the control scheme. The $V_S^F$ signal represents the converter output signal where the ripple has been eliminated by an additional filtering (represented by $C''_{dec}$ on FIG. 2 but which can be of different topology).

Figure 7B:
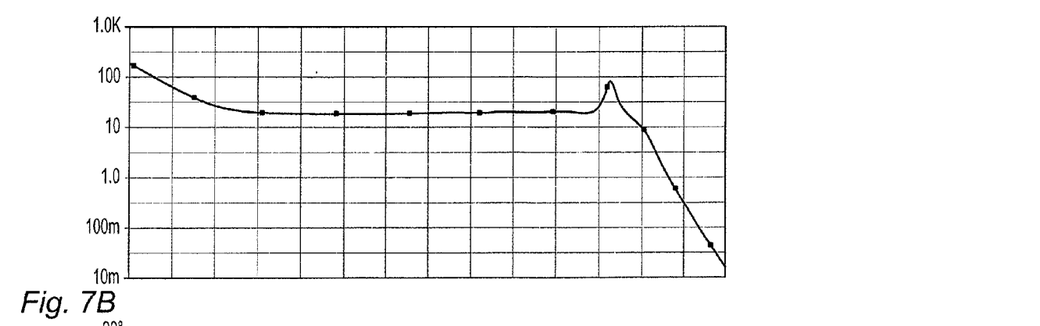
Figure 7C:
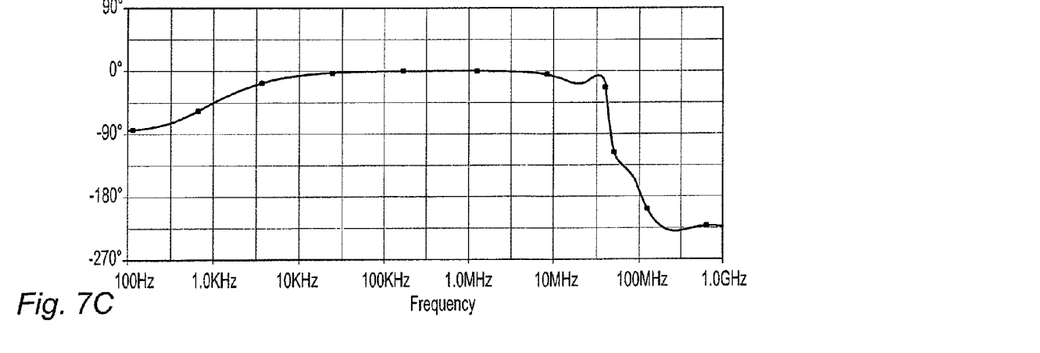

FIGS. 7B and 7C show, respectively, the open loop gain and phase of the control system of FIG. 6. It can be seen that the phase response is reasonably flat up to about 30 MHz: this means that the envelope tracking will work as expected for envelope bandwidths up to 30 MHz.

The invention has been disclosed with reference to a specific technology (GaN transistors, or more generally N-type transistors) and a specific application (space telecommunications). However, the scope of the invention is more general and also applies to different technologies and applications. In particular, the switching transistor $T_S$ can be either of the enhancement (normally off) type or of the depletion (normally on) type, and of GaAs or LDMOS technologies. Same applies to the RF transistor $T_A$.

The invention claimed is:

1. A radio-frequency power amplifier with envelope tracking, comprising a power RF amplifying device for amplifying a RF signal and a switching DC/DC converter for providing said power RF amplifying device with a DC power supply at a voltage level proportional to an envelope of said RF signal; wherein said switching DC/DC converter has a reversed buck topology, wherein said power RF amplifying device is connected between a first conductor which, during operation, is maintained at a constant positive voltage with respect to a ground reference point, and a second conductor serving as a local voltage reference; and wherein said switching DC/DC converter is connected for setting the voltage level of said second conductor with respect to said ground reference point at a positive value which is lower than the voltage of said first conductor, and in that the radio-frequency power amplifier further comprises a first blocking capacitor connected between an output port of said power RF amplifying device and an RF-load, and a second blocking capacitor connected between an input port of said RF amplifying device and an RF input signal source, and wherein said switching DC/DC converter comprises a switching device having a first terminal connected to said ground reference point and a second terminal connected to said second conductor through an inductor and to said first conductor through a rectifier, said rectifier being configured to allow current flow only from said switch to said first conductor, also comprising filter capacitor connected between said first conductor and said second conductor.

2. A radio-frequency power amplifier according to claim 1, wherein said switching device is a N-type Field Effect Transistor, said first terminal being a source and said second terminal being a drain.

3. A radio-frequency power amplifier according to claim 2, wherein said switching device is a GaN transistor.

4. A radio-frequency power amplifier according to claim 1, further comprising a decoupling capacitor connected between said second conductor and said ground reference point.

5. A radio-frequency power amplifier according to claim 1, further comprising a driving circuit for driving said switching device with a PWM signal representative of the envelope of the RF signal to be amplified.

6. A radio-frequency power amplifier according to claim 5 wherein said driving circuit is configured for driving said switching device in such a way that the voltage difference between said first conductor and said second conductor is proportional to said envelope of said RF signal.

7. A radio-frequency power amplifier according to claim 5, wherein said PWM signal has a frequency greater or equal to 20 MHz, and wherein said constant positive voltage of the first conductor is greater or equal to 25 V.

8. A radio-frequency power amplifier according to claim 5, wherein said PWM signal has a frequency greater or equal to 50 MHz, and wherein said constant positive voltage of the first conductor is greater or equal to 25 V.

9. A radio-frequency power amplifier according to claim 5, wherein said PWM signal has a frequency greater or equal to 50 MHz, and wherein said constant positive voltage of the first conductor is greater or equal to 50 V.

10. A radio-frequency power amplifier according to claim 5, wherein said PWM signal has a frequency greater or equal to 50 MHz, and wherein said constant positive voltage of the first conductor is greater or equal to 100 V.

11. A radio-frequency power amplifier according to claim 5, wherein said PWM signal has a frequency greater or equal to 20 MHz, and wherein said constant positive voltage of the first conductor is greater or equal to 50 V.

12. A radio-frequency power amplifier according to claim 5, wherein said PWM signal has a frequency greater or equal to 20 MHz, and wherein said constant positive voltage of the first conductor is greater or equal to 100 V.

* * * * *